United States Patent
Divakaruni et al.

(10) Patent No.: US 6,897,107 B2
(45) Date of Patent: May 24, 2005

(54) METHOD FOR FORMING TTO NITRIDE LINER FOR IMPROVED COLLAR PROTECTION AND TTO RELIABILITY

(75) Inventors: Rama Divakaruni, Somers, NY (US); Thomas W. Dyer, Pleasant Valley, NY (US); Rajeev Malik, Wappingers Falls, NY (US); Jack A. Mandelman, Stormville, NY (US); Venkatachajam C. Jaiprakash, Fremont, NY (US)

(73) Assignees: International Business Machines Corporation, Armonk, NY (US); Infineon Technologies North America Corporation, San Jose, CA (US)

(*) Notice: Subject to any disclaimer, the term of this patent is extended or adjusted under 35 U.S.C. 154(b) by 0 days.

(21) Appl. No.: 10/720,490

(22) Filed: Nov. 24, 2003

(65) Prior Publication Data
US 2004/0106258 A1 Jun. 3, 2004

Related U.S. Application Data

(62) Division of application No. 09/832,605, filed on Apr. 11, 2001, now Pat. No. 6,809,368.

(51) Int. Cl.[7] .................... H01L 21/8242; H01L 21/20
(52) U.S. Cl. ................. 438/243; 438/242; 438/386
(58) Field of Search .................... 257/302, 303, 257/301; 438/243, 386, 242

(56) References Cited

U.S. PATENT DOCUMENTS

| | | | |
|---|---|---|---|
| 5,831,301 A | 11/1998 | Horak et al. | |
| 5,940,717 A | 8/1999 | Rengarajan et al. | |
| 5,945,704 A | 8/1999 | Schrems et al. | |
| 6,018,174 A | 1/2000 | Schrems et al. | |
| 6,063,657 A | 5/2000 | Bronner et al. | |
| 6,066,527 A | 5/2000 | Kudelka et al. | |
| 6,080,618 A | 6/2000 | Bergner et al. | |
| 6,144,054 A | 11/2000 | Agahi et al. | |
| 6,437,381 B1 | 8/2002 | Gruening et al. | |

FOREIGN PATENT DOCUMENTS

JP  5-175424  7/1993

*Primary Examiner*—Steven Loke
(74) *Attorney, Agent, or Firm*—Scully, Scott, Murphy & Presser; Todd M.C. Li, Esq.

(57) ABSTRACT

A structure and method which enables the deposit of a thin nitride liner just before Trench Top Oxide TTO (High Density Plasma) HDP deposition during the formation of a vertical MOSFET DRAM cell device. This liner is subsequently removed after TTO sidewall etch. One function of this liner is to protect the collar oxide from being etched during the TTO oxide sidewall etch and generally provides lateral etch protection which is not realized in the current processing scheme. The process sequence does not rely on previously deposited films for collar protection, and decouples TTO sidewall etch protection from previous processing steps to provide additional process flexibility, such as allowing a thinner strap Cut Mask nitride and greater nitride etching during node nitride removal and buried strap nitrided interface removal. Advantageously, the presence of the nitride liner beneath the TTO reduces possibility of TTO dielectric breakdown between the gate and capacitor node electrode of the vertical MOSFET DRAM cell, while assuring strap diffusion to gate conductor overlap.

10 Claims, 9 Drawing Sheets

METHOD FOR FORMING TTO NITRIDE LINER FOR IMPROVED COLLAR PROTECTION AND TTO RELIABILITY

CROSS REFERENCE TO RELATED APPLICATION

The present application is a divisional of application Ser. No. 09/832,605 filed on Apr. 11, 2001 now U.S. Pat. No. 6,809,368, the entire contents of which is incorporated herein by its reference.

BACKGROUND OF THE INVENTION

1. Field of the Invention

The present invention relates to semiconductor devices, and more particularly, to a trench top oxide (TTO) nitride liner for improved collar protection and TTO reliability in trench-capacitor vertical dynamic random access memory (DRAM) cell array devices.

2. Discussion of the Prior Art

A processing scheme employed in forming the above-described vertical DRAM cell arrays is described in detail in commonly-owned, co-pending U.S. patent application Ser. No. 09/777,576 entitled STRUCTURE AND METHOD FOR A COMPACT TRENCH-CAPACITOR DRAM CELL WITH BODY CONTACT the contents and disclosure of which are incorporated by reference as if fully set forth herein. Described now with reference to FIGS. 1(a)–1(f) are the various processing steps for forming vertical DRAM cell arrays. As shown in FIG. 1(a), there is depicted an initial structure that is employed in fabricating a vertical DRAM cell array. Specifically, FIG. 1(a) shows an array portion of the structure that includes Si-containing substrate 10 having a material stack comprising an etch stop pad layer 12 and a hard mask 14 formed thereon. The substrate may include well regions 11, or the well regions may be formed later in the process.

The structure shown in FIG. 1(a) is made from conventional materials that are well known to those skilled in the art and conventional processes also well known in the art are employed in fabricating the same. For example, etch stop pad layer 12 may be composed of an oxide such as $SiO_2$ and is formed on a surface of Si-containing substrate utilizing a conventional thermal growing process and thereafter hard mask 14, e.g., SiN, is formed on etch stop pad layer 12 by a conventional deposition process such as chemical vapor deposition (CVD), plasma-assisted CVD, sputtering, or chemical solution deposition. It should be understood that, additionally, a thick oxide layer may be formed over the SiN layer to serve as an improved hard mask during subsequent trench etching. Further, the thickness of each layer of the material stack may vary. Typically, however, the etch stop pad layer has a thickness of about 5 nm or less and the hard mask has a thickness of from about 10 to about 1000 nm.

Next, deep trenches 16 are formed in the structure shown in FIG. 1(a) providing the structure shown in FIG. 1(b). The term "deep trench" is used herein to denote a trench whose depth from the top surface of Si-containing substrate 10 is from about 1.0 μm or greater. The deep trenches are formed in the conventional manner of opening a trench pattern extending through the hard mask, the etch stop pad layer and a portion of the Si-containing substrate via lithography and anisotropic etching. Note deep trenches 16, which are formed in rows and columns into the Si-containing substrate, are the areas in which the storage capacitor and vertical MOSFETs are formed.

A polysilicon buffered LOCOS (local oxidation of silicon) collar or other like collar oxide 18 is then formed in a portion of the deep trench, See FIG. 1(c). Next, a capacitor (not shown in the drawings) is formed in the lower portion of the deep trench utilizing conventional processing steps well known to those skilled in the art. Included in the deep trench-processing steps is the formation of a buried plate diffusion region (not shown) and formation of node dielectric 20 about said buried plate diffusion region. As shown in FIG. 1(c), node dielectric 20 extends from the lower portion of the deep trench to the upper surface of the deep trench and is formed on walls thereof. In the upper portion of the deep trench, the node dielectric serves as an etch stop layer during the formation of the buried-strap region. In the lower portion of the deep trench, the node dielectric separates the buried plate diffusion region from the deep trench conductor.

The node dielectric, which is composed of a conventional dielectric material such as a layered SiN/SiO structure, is formed by conventional processes such as thermal nitridation, CVD, plasma-assisted CVD, sputtering deposition, and the like. The deep trench is then filled with deep trench conductor 22 such as polysilicon and thereafter the deep trench conductor is recessed by conventional means to a depth which is desired for the strap (determines the channel length of the vertical MOSFET; typically of from about 100 to about 400 nm). The structure containing recessed deep trench conductor 22 is shown in FIG. 1(d).

At this point of the process, a strap process, such as described in Radens, et al. "An Orthogonal $6F^2$ Trench-Sidewall Vertical Device Cell for 4 Gb/16 Gb DRAM", IEDM 2000 Tech. Dig., p. 349, is employed in forming buried-strap outdiffusion region 24; see FIG. 1(e). In the exemplary structure shown in FIG. 1(e), a one-sided strap (OSS) process is employed to form straps facing each other. It is understood however, that other layouts may form straps such that they do not face each other or, are on both sides of the trench. That is, other types of vertical $MOSFET^3$ cells may employ straps on more than a single sidewall of the trench. Note that the OSS process does not etch one of the collar oxide regions, and on that side of structure is the area in which body continuity 19 is achieved. Specifically, the buried-strap outdiffusion region is formed as follows: First, an oxide layer (not shown) is formed over the recessed deep trench conductor, followed by an etch stop liner which lines the node dielectric as well as the oxide layer previously deposited and thereafter a polysilicon placeholder material (not shown in the drawings) is formed in the upper region of the deep trench covering the exposed portions of the etch stop liner. Next, a portion of the polysilicon placeholder material on the side of the deep trench where the buried-strap is desired is etched down to the etch stop liner overlying the oxide layer at the top of the recessed conductive material.

An OSS process is then performed which may include the following processing steps: removing a portion of the polysilicon placeholder material using an etch process that is selective to the etch stop liner on a side of the deep trench where a strap is to be formed; removing the exposed collar oxide by utilizing an isotropic oxide etching process; removing portions of the etch stop liner and the node dielectric that are not protected by the remaining region of the polysilicon placeholder material; removing the remaining polysilicon placeholder material; opening a portion of the oxide layer over the deep trench polysilicon not covered by the etch stop liner; continuing the oxide etching so as to form a divot in the top collar oxide at approximately the top level of the deep trench conductor; and filling the divot with a conductive material such as doped polysilicon so as to provide a bridge between the deep trench conductor and the wall of the trench. During a subsequent annealing step, dopant from the divot filled region diffuses forming buried-strap outdiffusion region 24. The divot filled collar oxide region is labeled as 26 in the drawings. Note that on the remaining wall portion of the structure not containing buried-strap outdiffusion 24 and divot filled collar oxide region 26 is an "intact" collar oxide region 18, both directly beneath the divot filled region 26 and also on the wall not having a strap which extends all the way to the etch stop pad layer 12. The intact collar oxide serves to electrically isolate body region 19 from trench capacitor 22.

As is also shown in FIG. 1(e), trench top oxide (TTO) 28 is formed on all horizontal surfaces including deep trench conductor 22 and divot filled collar oxide region 26 utilizing conventional deposition processes such as high-density plasma-assisted deposition and thereafter a conventional resist recess process is employed to remove the trench top oxide from top surfaces of the structure. A sacrificial oxide layer (not shown) is next formed and stripped utilizing conventional lithography and etching and gate dielectric 30 such as an oxide is formed on the exposed walls of the upper portion of the deep trench. The gate dielectric is formed utilizing any well-known process such as thermal oxidation of silicon or by nitridation of an oxide and thereafter, a gate conductor 32 such as doped polysilicon is then formed on top trench oxide 28. The structure 32 is then planarized to hard mask 14 and thereafter, as shown in FIG. 1(f), the gate conductor 32 is recessed utilizing a conventional recessing process. Alternatively, a deposited gate dielectric, such as by CVD or ALD (atomic layer deposition), may be formed. The recessed gate conductor 32 is then capped with CVD oxide 34, using well known conventionally practiced processes.

It is the case that during the stripping of the sacrificial oxide layer at the exposed walls of the upper portion of the deep trench, portions of the TTO for protecting the collar and strap regions are at risk, with excessive etching possibly causing collar loss at the sides, edges and top, and moreover, loss of the doped polysilicon divot.

It would be highly desirable to eliminate collar oxide loss and loss of the doped polysilicon divot that may result from such sidewall etching.

It would be further highly desirable to enhance the degree of electrical isolation between the formed gate conductor and the capacitor electrode (deep trench conductor) in such a trench-capacitor vertical dynamic random access memory (DRAM) cell array device.

Additionally, it would be highly desirable to enable a thinner isolation region between the gate conductor and the capacitor electrode, to thereby assure the required overlap between strap diffusion and the gate conductor.

SUMMARY OF THE INVENTION

It is thus an object of the present invention to provide a TTO nitride liner for improved collar protection and polysilicon divot protection and TTO reliability during sidewall etch steps in trench-capacitor vertical dynamic random access memory (DRAM) cell array device processing.

It is another object of the present invention to enhance the degree of electrical isolation between the formed gate conductor and the capacitor electrode (deep trench conductor) in such a trench-capacitor vertical dynamic random access memory (DRAM) cell array device.

It is yet another object of the present invention to enable fabrication of a thinner isolation region between the gate conductor and the capacitor electrode (deep trench conductor) in such a trench-capacitor vertical dynamic random access memory (DRAM) cell array device, to thereby assure the required overlap between a strap diffusion and the gate conductor without compromising breakdown reliability.

It is a further object of the present invention to provide flexibility in the TTO deposition process.

In accordance with the teachings herein, there is provided a structure and method of forming a DRAM cell array comprising the steps of:

(a) forming a plurality of deep trenches in an array portion of a Si-containing substrate having at least a hard mask formed thereon, said plurality of deep trenches being arranged in rows and columns and including at least collar oxide regions formed on walls thereof and a recessed deep trench conductor formed between said collar oxide regions and defining a capacitor electrode for a DRAM cell;

(b) forming a buried-strap outdiffusion region within a portion of the wall such that the portion partially encircles the wall;

(c) forming a nitride liner layer above a horizontal surface of the deep trench conductor and enclosing exposed sidewall and collar oxide regions;

(d) depositing top trench oxide (TTO) layer above the formed nitride liner layer;

(e) performing TTO sidewall etch to remove TTO oxide which has been deposited on the vertical sidewalls and collar oxide, the nitride liner acting to protect the collar oxide layer from being etched;

(f) performing nitride liner etch to remove the portion of the TTO nitride liner which is exposed after TTO oxide removal; and, (g) forming a vertical MOSFET by growing a gate dielectric on exposed walls of the deep trenches and forming a gate conductor above the TTO oxide layer within the walls of the deep trenches lined with the gate dielectric, wherein the formed TTO layer having underlying nitride liner eliminates possibility of TTO dielectric breakdown between the gate conductor and the capacitor electrode of a DRAM cell.

The deposition of a thin nitride liner just before TTO (Heavy Deposition Plasma) HDP deposition according to the invention functions to protect the collar oxide from being etched during the TTO oxide sidewall etch and provides additional lateral etch protection which is not realized in current processing schemes.

The process sequence does not rely on previously deposited films for collar protection, such as the Cut Mask (CM) nitride in the current processing scheme—POR (Process of Record). This decoupling of TTO sidewall etch protection from previous processing steps provides additional process flexibility, such as allowing a thinner CM nitride and greater nitride etching during node nitride removal and buried strap nitrided interface removal. The sequence allows the complete removal of the CM nitride before buried strap poly deposition, thereby eliminating the possibility of trapped poly under the CM nitride along the remaining collar which is a serious concern in the current process.

Advantageously, the system and method of the invention eliminates the possibility of TTO dielectric breakdown between the gate and node electrode of the formed trench-capacitor in a vertical dynamic random access memory (DRAM) cell array device.

BRIEF DISCRIPTION OF THE DRAWINGS

The foregoing objects and advantages of the present invention may be more readily understood by one skilled in the art with reference being had to the following detailed description of several preferred embodiments thereof, taken in conjunction with the accompanying drawings wherein like elements are designated by identical reference numerals throughout the several views, and in which:

FIGS. 1(a)–1(f) are cross-sectional views of the conventional vertical DRAM cell array through various processing steps.

FIGS. 2(a)–(f) illustrates the process step of depositing a TTO nitride liner before depositing a TTO HDP oxide according to the invention.

DETAILED DESCRIPTION OF THE PREFERRED EMBODIMENTS

Figure 1A:
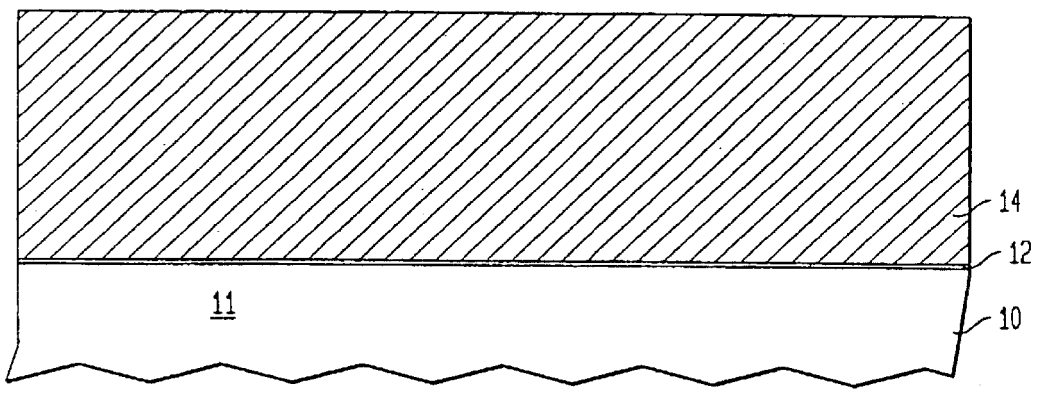
Figure 1B:
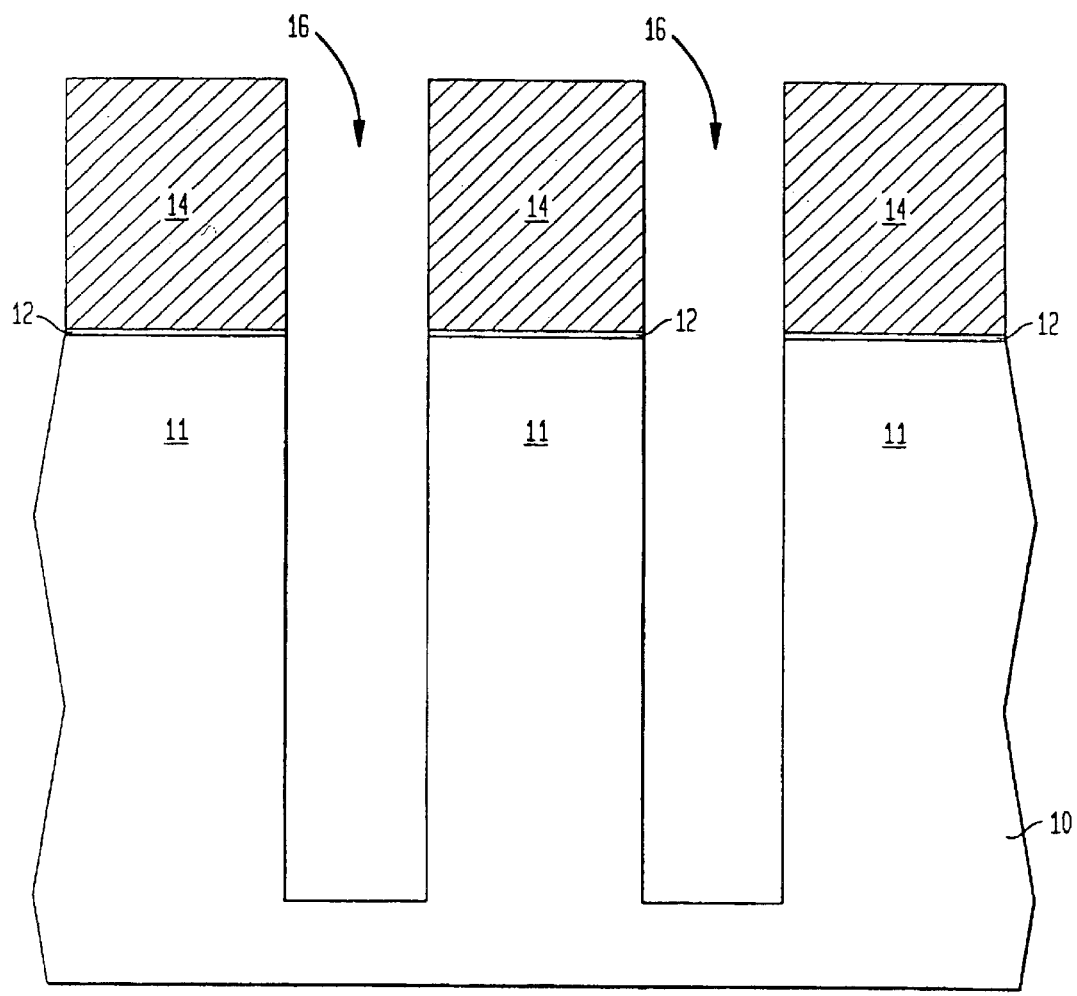
Figure 1C:
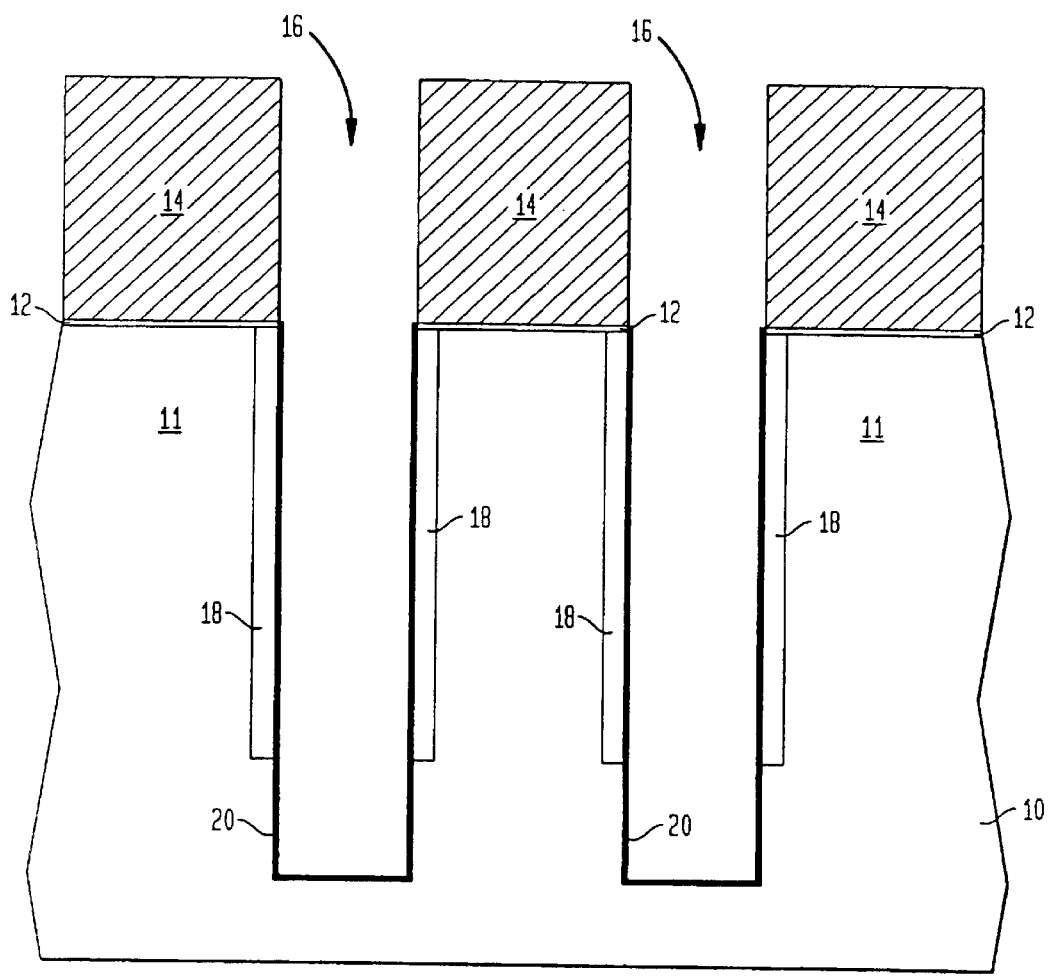
Figure 1D:
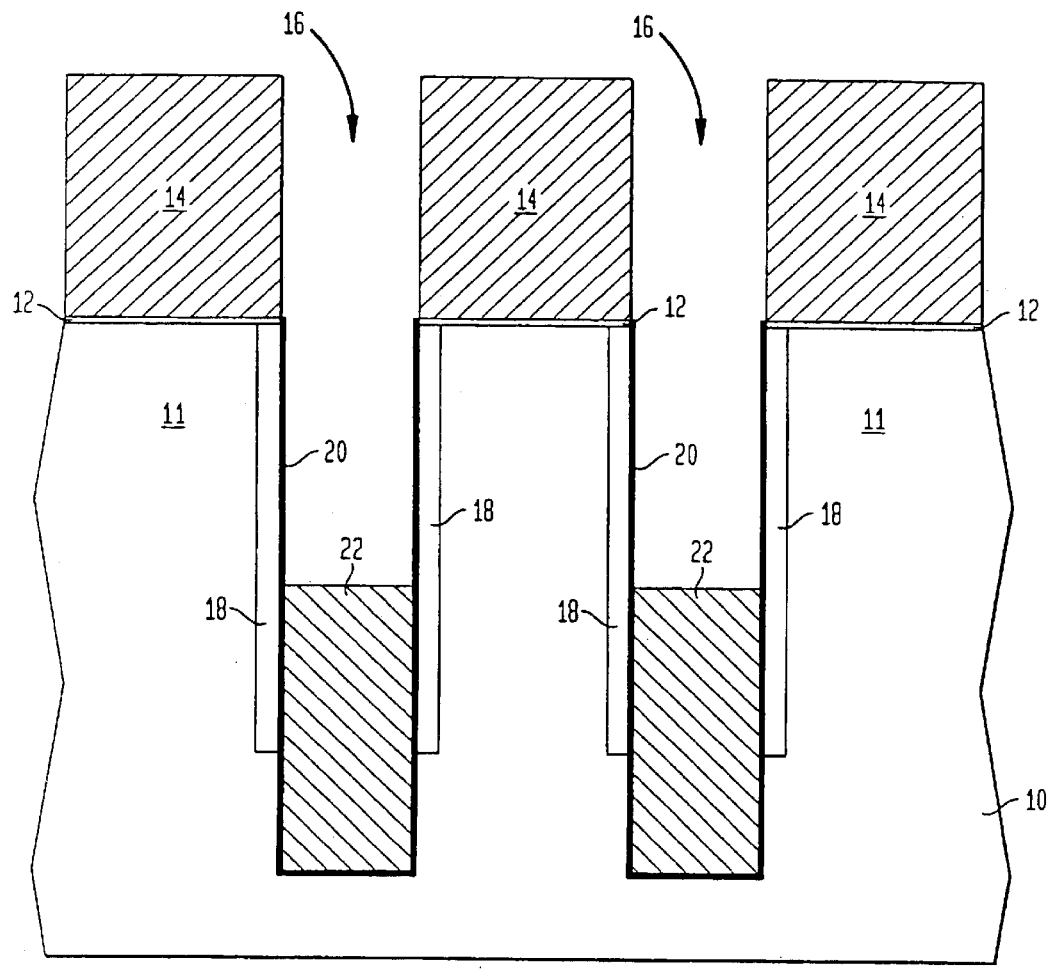

Referring to the drawings in detail, FIG. 2(a)–2(h) depict the TTO nitride liner process and resulting structure 49 for the trench-capacitor vertical dynamic random access memory (DRAM) cell array device having improved TTO reliability according to the present invention.

Figure 1E:
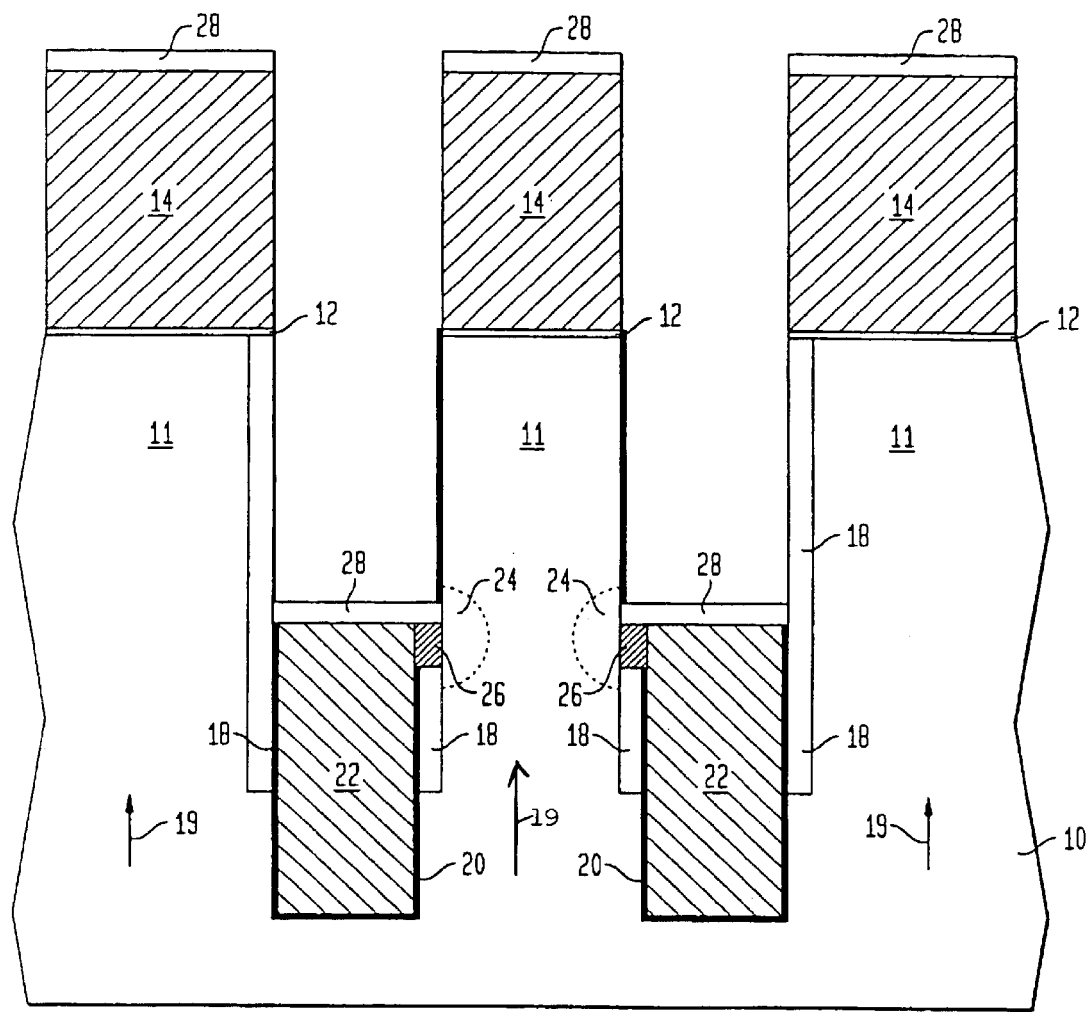
Figure 2A:
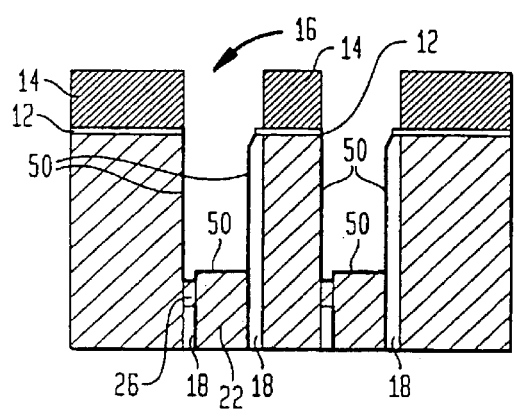

Referring to FIG. 2(a), after forming the one-sided buried strap and divot 26 and collar 18 in the device recess with the pad nitride 14 still in place, and prior to forming the trench top oxide (TTO) (in the deep trench of FIG. 1(e)), a TTO nitride liner 50 is first deposited in the trench recess 16 that remains in the upper portion of the trench for protecting the exposed deep trench sidewalls and particularly the exposed collar oxide layer 18. This nitride liner may be SiN or other like nitride material deposited to a thickness ranging from 1.0 nm–10.0 nm using a known conformal process before depositing the TTO (High Density Plasma) HDP oxide.

Figure 3:
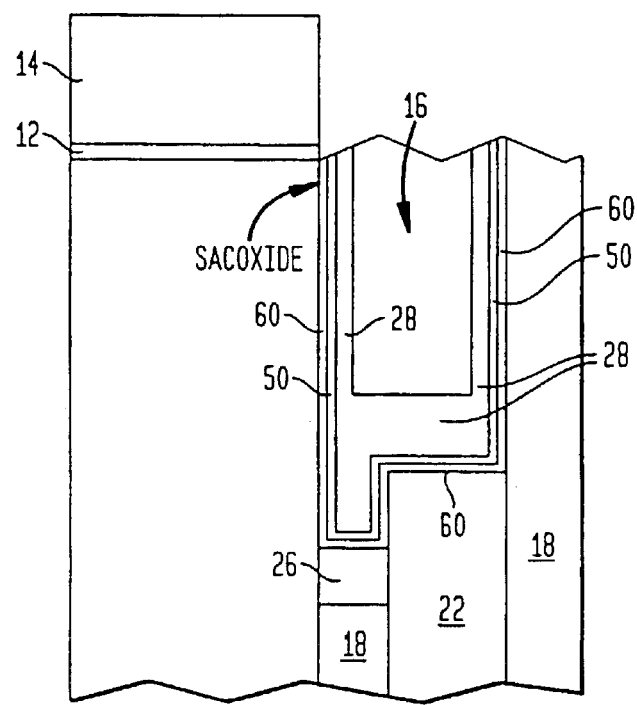
FIG. 3 is a detailed illustration of the resulting channel structure when optional sacrificial oxide layer 60 is formed prior to nitride liner deposition 50.

As discussed in greater detail herein with respect to FIG. 3, an optional step is provided whereby a sacrificial gate oxide layer is first grown prior to depositing the TTO nitride liner 28. Alternately, the sacrificial oxide may be grown and removed away after the nitride liner is removed from the channel region just before gate oxidation.

Figure 2B:
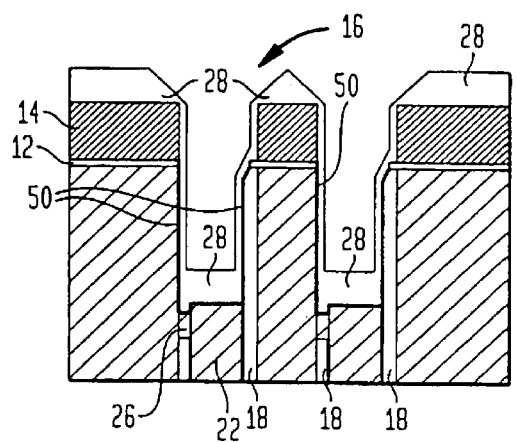

FIG. 2(b) illustrates the deposition of the TTO HDP oxide 28 (using non-conformal deposition process, for example) over the TTO nitride liner 50. FIG. 3 is a detailed illustration of the resulting channel structure if optional sacrificial oxide layer 60 is formed prior to nitride liner deposition 50. FIG. 3 shows that the sacrificial oxide layer 50 is formed above horizontal surfaces of the deep trench conductors 22 and over exposed sidewalls and collar oxide regions 18. As known to skilled artisans, sacrificial oxide layer thickness may vary depending upon the formation process and the oxide material. According to the invention, the optional sacrificial oxide layer thickness may range anywhere from about 2.0 to 20.0 nm.

Figure 2C:
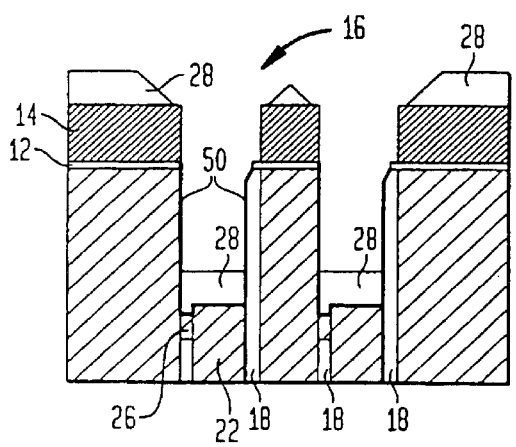

Afterwards, as depicted in FIG. 2(c), a TTO sidewall etch is performed to remove the excess TTO HDP oxide which has been deposited on the vertical sidewalls and collar oxide 18. This process step may implement a standard isotropic wet etch that is selective to the TTO nitride liner 50 which functions to protect the remaining collar oxide 18 from being etched directly and laterally from around the sides.

Figure 2D:
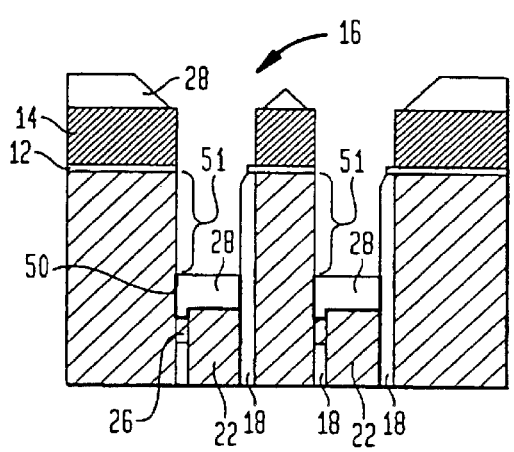
Figure 4:
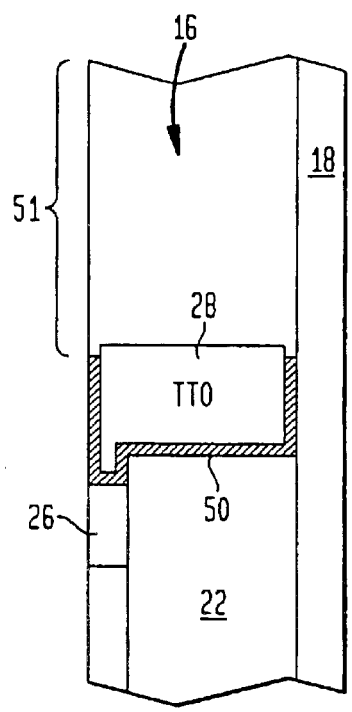
FIG. 4 is a detailed illustration of the resulting structure after the TTO sidewall nitride etch is performed and assuming no sacrificial oxide had been previously deposited.

In the next processing step as depicted in FIG. 2(d), the portion 51 of the TTO nitride liner which is now not covered by the TTO HDP oxide 28 is removed. This nitride etch need only be selective to oxide in the case where a sacrificial oxide layer is used under the liner. It would be selective to oxide and silicon in the case where no sacrificial oxide is used under the liner. FIG. 4 is a detailed illustration of the resulting structure after the nitride etch is performed and assuming no sacrificial oxide had been previously deposited. This is the structure that results prior to gate poly (α-Si) formation in the deep trench 16. It should be understood that the resulting DRAM cell structure having an SiN (nitride layer) 50 under the TTO reduces possibility of TTO dielectric breakdown between the formed gate and capacitor node (deep trench) electrode 22.

Figure 2E:
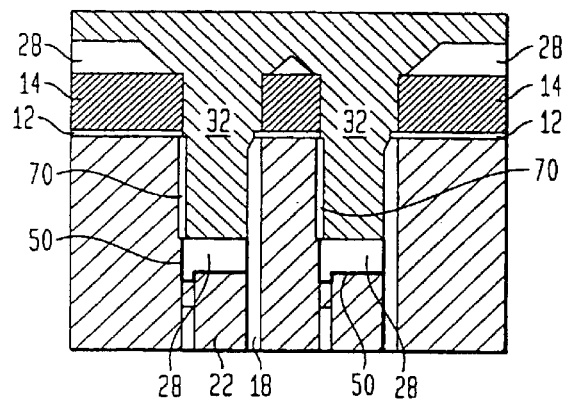

FIG. 2(e) illustrates that if sacrificial oxide layer 60 was grown under the TTO nitride liner, it is now removed and the gate oxide 70 grown. If no sacrificial oxide layer had been formed under the nitride liner 50, it is now grown and etched just prior to gate oxidation. If no sacrificial oxide is used, the gate oxide is grown after removing the TTO nitride (and buried strap nitride interface) from the deep trench 16.

Figure 1F:
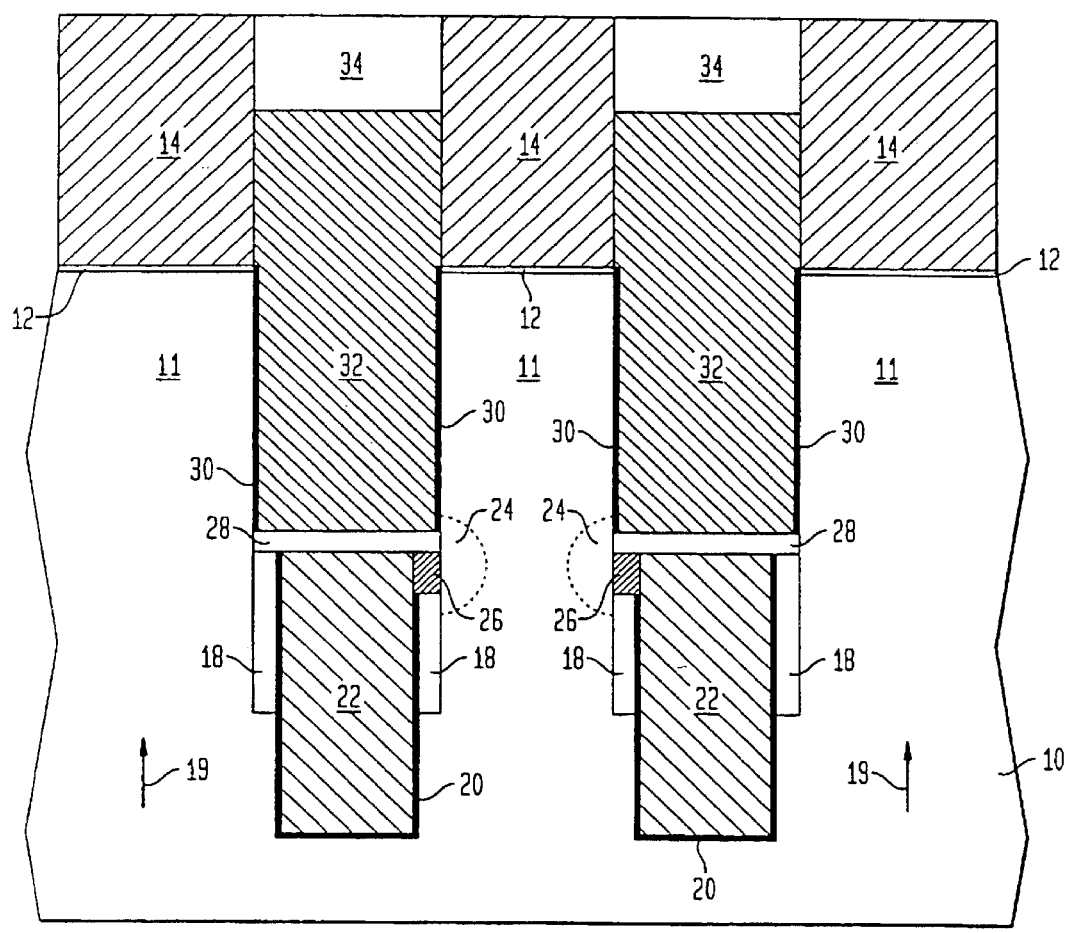
Figure 2F:
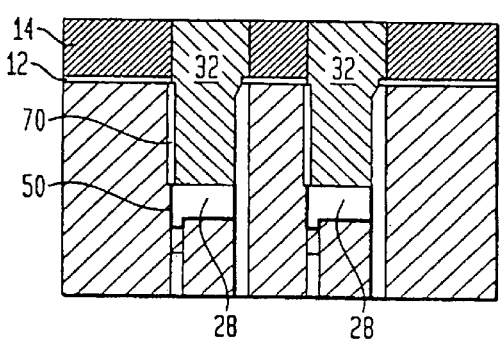

After growing the gate oxide 70, the gate conductor polysilicon (or α-Si) deposited as described herein with respect to FIG. 1(f). FIG. 2(f) illustrates removal of the excess gate poly and the TTO HDP oxide 28 on the top of the pad nitride 14 down to the level of the pad nitride. The gate poly 70 and the TTO HDP 28 on the pad nitride 14 are removed by any of the techniques discussed in commonly-owned, co-pending U.S. patent application Ser. No. 09/675,435, entitled AN EXTENDIBLE PROCESS FOR IMPROVED TOP OXIDE LAYER FOR DRAM ARRAY AND THE GATE INTERCONNECTS WHILE PROVIDING SELF-ALIGNED GATE CONTACTS the whole contents and disclosure of which is incorporated by reference as if fully set forth herein.

Figure 2G:
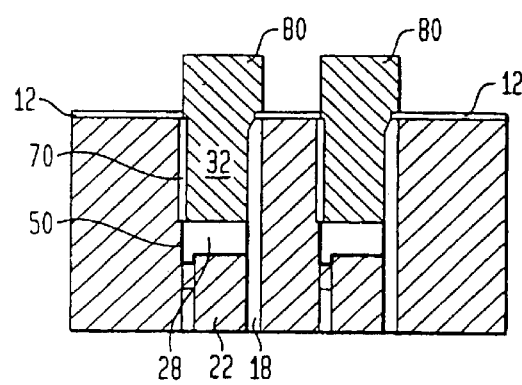

FIG. 2(g) illustrates the next step of removing the pad nitride 14 by stripping it away selective to the gate poly 12 leaving poly pillars 80 extending above the silicon surface, as discussed in co-pending U.S. patent application Ser. No. 09/675,435. An optional Contact to Bitline (CB) etch-stop liner may also be deposited on the substrate surface at this stage in the process. This liner could be selectively removed from the tops of the poly-Si after the top oxide is deposited and planarized down to expose only these top surfaces.

Figure 2H:
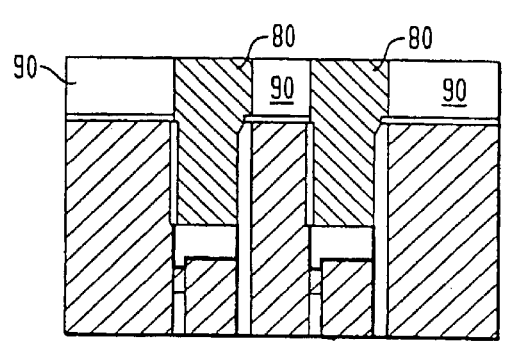

FIG. 2(h) illustrates that finally the HDP oxide 90 is deposited over the poly pillars, and the top oxide HDP is removed (e.g. polished) down to the tops of the poly pillars, as discussed in co-pending U.S. patent application Ser. No. 09/675,435.

The deposition of a thin nitride liner just before TTO HDP deposition according to the invention functions to protect the collar oxide enclosed by the liner from being etched during the TTO oxide sidewall etch and provides additional lateral etch protection which is not realized in current processing schemes.

Collar oxide loss is also protected at the top due to cut mask CM nitride loss during the pad nitride strip since the liner is freshly applied just before TTO HDP deposition. Essentially, collar protection is decoupled from previous processing (e.g. CM nitride liner) for added process flexibility (e.g., allows thinner CM nitride which may be stripped away earlier to prevent trapped buried strap poly, and also allows restoration of node and buried strap interface nitride strip steps).

Nitride liner is easily removed from the top surface when combined with method disclosed in co-pending U.S. patent application Ser. No. 09/675,435 to avoid complications with CB etch.

While several embodiments and variations of the present invention for a TTO Nitride Liner for improved collar protection and TTO reliability are described in detail herein, it should be apparent that the disclosure and teachings of the present invention will suggest many alternative designs to those skilled in the art.

Having thus described our invention in detail, what we claim is new and desire to secure by the Letters Patent is:

1. A method of forming a DRAM cell array comprising the steps of:
   (a) forming a plurality of deep trenches in an array portion of a Si-containing substrate having at least a hard mask formed thereon, said plurality of deep trenches being arranged in rows and columns and including at least collar oxide regions formed on sidewalls of the deep trenches and recessed deep trench conductors formed in the deep trenches and defining capacitor electrodes for a DRAM cells;
   (b) forming buried-strap outdiffusion regions within portions of said sidewalls;
   (c) forming a nitride liner layer above horizontal surfaces of said deep trench conductors and enclosing exposed sidewalls said collar oxide regions;
   (d) depositing a top trench oxide (TTO) layer above said formed nitride liner layer;
   (e) performing a TTO sidewall etch to remove TTO oxide which has been deposited on the vertical sidewalls of the trenches and said collar oxide regions, said nitride liner acting to protect said collar oxide regions from being etched;
   (f) performing a nitride liner etch to remove portions of the TTO nitride liner which are exposed after TTO oxide removal;
   (g) forming a vertical MOSFET by growing a gate dielectric on exposed sidewalls of each of said deep trenches and forming gate conductors above said TTO oxide layer within the sidewalls of the deep trenches lined with said gate dielectric, wherein said formed TTO layer having an underlying nitride liner eliminates possibility of TTO dielectric breakdown between said gate conductors and said capacitor electrodes of a DRAM cells.

2. The method of claim 1, wherein prior to said step (c), the step of depositing sacrificial oxide layers above horizontal surfaces of said deep trench conductors and said over exposed sidewalls and collar oxide regions.

3. The method of claim 2, wherein said nitride liner etch of step f) stops at and does not etch said sacrificial oxide layers.

4. The method of claim 1, wherein said nitride liner etch of step f) stops at and does not etch the collar oxide regions and said Si-containing substrate.

5. The method of claim 1, wherein said collar oxide regions are formed by a local oxidation of silicon process.

6. The method of claim 5, wherein after forming said collar oxide regions capacitors are formed in bottom portions of said deep trenches.

7. The method of claim 6, wherein said capacitors are formed by the steps of: forming buried plate diffusion regions about said deep trenches, lining walls of said deep trenches with a node dielectric and filling said deep trenches with said deep trench conductors.

8. The method of claim 6, wherein said recessed deep trench conductors are formed by deposition of deep trench conductors and etching.

9. The method of claim 1, wherein said buried-strap outdiffusion regions are formed by a one-sided strap process.

10. The method of claim 9, wherein said one-sided strap process includes forming a divot on each of said collar oxide regions.

* * * * *